United States Patent
Zeng et al.

(10) Patent No.: US 10,897,242 B2
(45) Date of Patent: Jan. 19, 2021

(54) FREQUENCY DEMULTIPLICATION ADJUSTMENT METHOD OF PLL

(71) Applicant: AMLOGIC (SHANGHAI) CO., LTD., Shanghai (CN)

(72) Inventors: Tao Zeng, Shanghai (CN); Yong Wan, Shanghai (CN)

(73) Assignee: AMLOGIC (SHANGHAI) CO., LTD., Shanghai (CN)

( * ) Notice: Subject to any disclaimer, the term of this patent is extended or adjusted under 35 U.S.C. 154(b) by 162 days.

(21) Appl. No.: 16/325,125

(22) PCT Filed: Sep. 27, 2018

(86) PCT No.: PCT/CN2018/108107
§ 371 (c)(1),
(2) Date: Feb. 12, 2019

(87) PCT Pub. No.: WO2019/091246
PCT Pub. Date: May 16, 2019

(65) Prior Publication Data
US 2020/0313663 A1    Oct. 1, 2020

(30) Foreign Application Priority Data
Nov. 7, 2017    (CN) .......................... 2017 1 1085273

(51) Int. Cl.
*H03L 7/08*    (2006.01)
*H03K 5/00*    (2006.01)

(52) U.S. Cl.
CPC .......... *H03K 5/00006* (2013.01); *H03L 7/08* (2013.01)

(58) Field of Classification Search
CPC ......... H03K 5/00006; H03L 7/08; H03L 7/16; H03L 7/18
See application file for complete search history.

(56) References Cited

U.S. PATENT DOCUMENTS 10,003,345 B2 * 6/2018 Lee ........................... H03L 7/23

FOREIGN PATENT DOCUMENTS

| CN | 1459692 A | 12/2003 |
|---|---|---|
| CN | 1485985 A | 3/2004 |

(Continued)

*Primary Examiner* — Jung Kim
(74) *Attorney, Agent, or Firm* — Innovation Capital Law Group, LLP; Vic Lin

(57) ABSTRACT

A frequency demultiplication adjustment method of PLL comprises obtaining a plurality of corresponding frequency demultiplication frequency points according to a default frequency demultiplication value of a phase-locked loop; obtaining a load state of the processor within a predetermined sampling period, and obtaining a target frequency point of the processor by the processor frequency adjustor; determining a frequency range of a virtual frequency point to be added according to the position of the target frequency point; performing calculation within the frequency range to obtain equivalent frequencies corresponding to virtual frequency points; judging whether the frequency of the target frequency point is equal to the equivalent frequency corresponding to the virtual frequency points; if not, switching the processor frequency adjustor to the corresponding frequency demultiplication frequency point; and adjusting the frequency demultiplication value of the phase-locked loop which outputs a clock source signal corresponding to the virtual frequency points to the processor.

8 Claims, 2 Drawing Sheets

(56) References Cited

FOREIGN PATENT DOCUMENTS

| CN | 103297040 A | 9/2013 |
| CN | 105375907 A | 3/2016 |

\* cited by examiner

FREQUENCY DEMULTIPLICATION ADJUSTMENT METHOD OF PLL

CROSS-REFERENCE TO RELATED APPLICATIONS

This application is a national phase of Ser. No.: PCT/CN2018/108107 filed Sep. 27, 2018, the entire contents of which is incorporated herein by reference, and which claims priority to and the benefit of Chinese Patent Application No. 201711085273.0 filed Nov. 7, 2017.

BACKGROUND OF THE INVENTION

1. Field of the Invention

The invention relates to the field of communication technologies, and more particularly, to a frequency demultiplication adjustment method of PLL.

2. Description of the Related Art

DVFS (Dynamic Voltage and Frequency Scaling) is one of the important functions of an embedded system. It dynamically adjusts an operating frequency and an operating voltage of a chip (for the same chip, the higher the frequency is, the higher the voltage required is), mainly depending on the different requirements for the computing power of the application running on the chip, thereby reaching the aim of energy saving. The frequency point required for the operation of the processor (CPU, Central Processing Unit) is generally supported by a PLL (Phase-Locked Loop) designed by the chip, such that the CPU can operate in a wide frequency range of dozens of MHz to 2 GHz. Since the above-mentioned frequency band range is relatively wide, most of the chip implementations adopt multiple PLLs. Specifically, when the frequency is low, it runs on one PLL; when the frequency is high, it runs on another PLL. However, some defects exist in the above-mentioned operation. If the load of the running application changes dramatically, the running clock source of the CPU may switch back and forth between the two PLLs very frequently, which will bring instability, particularly when the temperature of the CPU is high.

In another version of solution, the CPU only uses the clock source provided by the PLL having the highest frequency, the PLL is always locked at the highest frequency, and only the external frequency demultiplication value is modified during a frequency modulation. By adopting this solution, since the OD frequency demultiplication value can only be positive integers, such as 1, 2, 4, 8, a huge gap may be formed in the frequency. In this way, severe frequency fluctuations may be incurred when the load is large but not full.

SUMMARY OF THE INVENTION

For solving the foregoing problems existing in the process of dynamically adjusting the operating frequency of the processor, the present invention provides a frequency demultiplication adjustment method of PLL, which intends to provide a plurality of virtual frequency points, extend the frequency point range effectively, and to narrow a frequency difference between the frequency points, so as to avoid the problem of frequency fluctuation from the processor frequency adjustor.

The technical solutions are as follows:

A frequency demultiplication adjustment method of a phase-locked loop (PLL), applied to an embedded system, providing a phase-locked loop, a processor and a processor frequency adjustor;

wherein the method comprises following steps of:

Step S1, obtaining a plurality of corresponding frequency demultiplication frequency points according to a default frequency demultiplication value of the phase-locked loop;

Step S2, obtaining a load state of the processor within a predetermined sampling period, and obtaining a target frequency point of the processor according to the load state by the processor frequency adjustor;

Step S3, determining a frequency range of a virtual frequency point to be added according to the position of the target frequency point between the frequency points;

Step S4, performing calculation within the frequency range to obtain equivalent frequencies corresponding to a plurality of virtual frequency points;

Step S5, judging whether the frequency of the target frequency point is equal to the equivalent frequency corresponding to one of the virtual frequency points; if not, switching the processor frequency adjustor to the corresponding frequency demultiplication frequency point; and Step S6, adjusting the frequency demultiplication value of the phase-locked loop, so that the phase-locked loop outputs a clock source signal corresponding to the virtual frequency points to the processor.

Preferably, in Step S1, the phase-locked loop obtains the plurality of frequency points according to a maximum working rate and the plurality of default frequency demultiplication values of the processor;

wherein the plurality of default frequency demultiplication values are 1, 2, 4, 8, 16.

Preferably, in Step S3, obtaining a highest frequency point and a lowest frequency point from the frequency range, and defining N the virtual frequency points between the highest frequency point and the lowest frequency point, wherein N>0.

Preferably, in Step S4, the method further comprises following steps of:

Step S41, dividing the predetermined sampling period equally into M, wherein M=N+1;

Step 42, calculating a frequency corresponding to the m lowest frequency points and a frequency corresponding to the M−m highest frequency points to obtain an equivalent frequency corresponding to each of the plurality of virtual frequency points;

wherein M>m>0, and M, N and m are positive integers.

Preferably, in Step S42, a method for obtaining an equivalent frequency corresponding to each of the plurality of target virtual frequency points through the processor frequency adjustor is provided, which is given by the following formula:

$$fe = \frac{X \times fl + (M - X)fh}{M}$$

wherein fe represents the equivalent frequency corresponding to each of the plurality of target virtual frequency points, fl represents the frequency corresponding to the lowest frequency point, fh represents the frequency corresponding to the highest frequency point, M represents the number of the predetermined sampling period which is equally divided into, x(1, 2, 3 . . . m) represents the number, wherein M>m>0, and both M and m are positive integers.

Preferably, a timer is disposed in a kernel of the embedded system, the sampling period is equally divided into M by the timer, and the timer is configured to be turned off when switching the processor frequency adjustor to the frequency demultiplication frequency point.

Preferably, a counter is disposed in the kernel of the embedded system, within the sampling period, m interrupts are calculated by the counter, and the frequency demultiplication value of the phase-locked loop is modified in the m interrupts, such that the phase-locked loop is locked at the frequency corresponding to the lowest frequency point;

subsequently, M−m interrupts are calculated by the counter, and the frequency demultiplication value of the phase-locked loop is modified in the M−m interrupts, such that the phase-locked loop is locked at the frequency corresponding to the highest frequency point.

Preferably, the predetermined sampling period of the processor frequency adjustor is 100 ms.

The above-mentioned technical solutions have the following beneficial effects. By providing a plurality of virtual frequency points, the frequency point range can be extended effectively, a frequency difference between the frequency points can be narrowed, and thus the problem of frequency fluctuation from the processor frequency adjustor can be avoided. In addition, some problems in the prior art that available frequency points are insufficient and a difference between the frequencies corresponding to each frequency point is large can be solved after the phase-locked loop is fixed.

BRIEF DESCRIPTION OF THE DRAWINGS

The accompanying drawings, together with the specification, illustrate exemplary embodiments of the present disclosure, and, together with the description, serve to explain the principles of the present invention.

DETAILED DESCRIPTION

Figure 1:
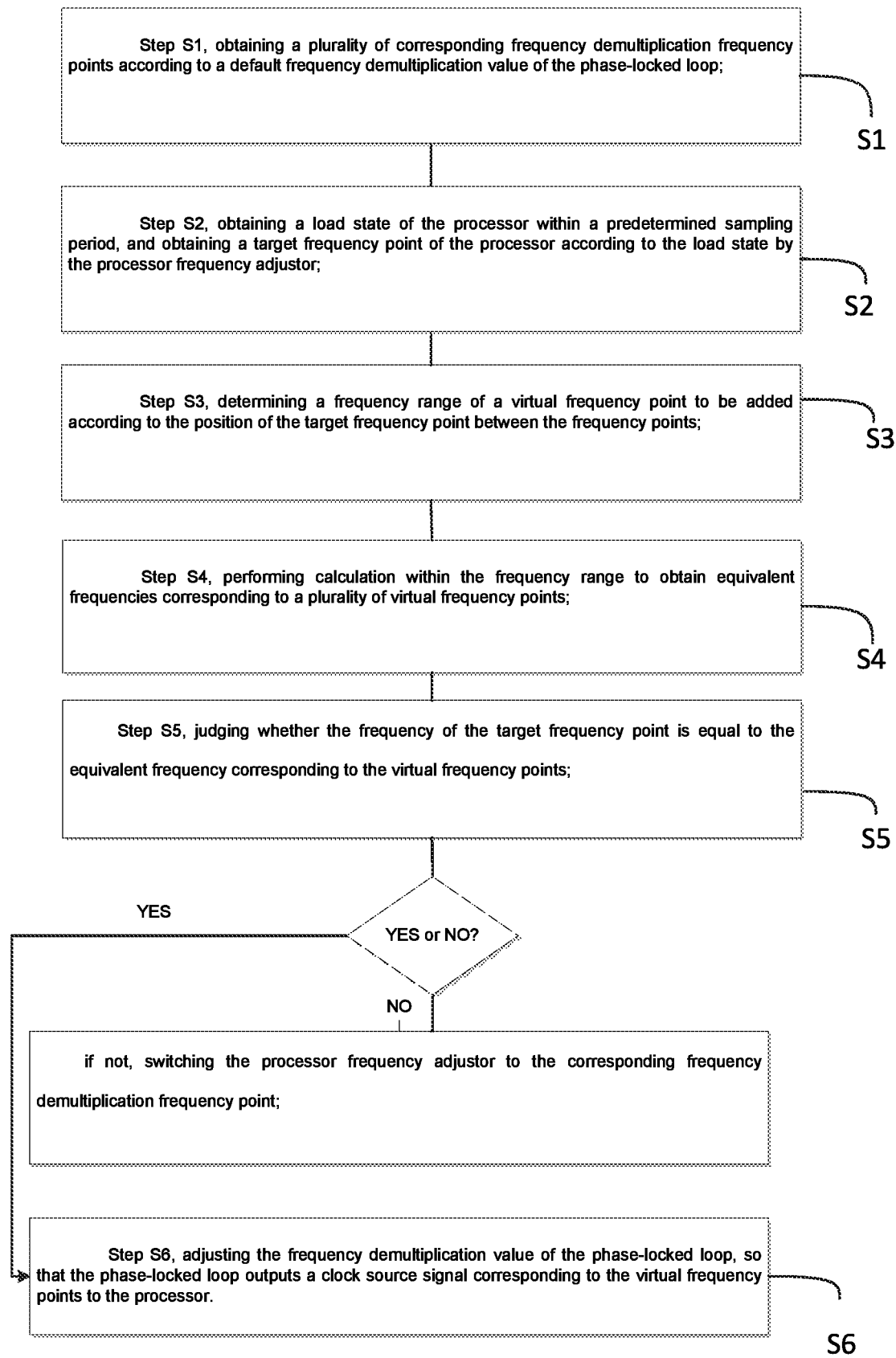
FIG. 1 is a flowchart of a frequency demultiplication adjustment method of PLL according to an embodiment of the present invention.

The present invention will now be described more fully hereinafter with reference to the accompanying drawings, in which exemplary embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" or "has" and/or "having" when used herein, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

As used herein, "around", "about" or "approximately" shall generally mean within 20 percent, preferably within 10 percent, and more preferably within 5 percent of a given value or range. Numerical quantities given herein are approximate, meaning that the term "around", "about" or "approximately" can be inferred if not expressly stated.

As used herein, the term "plurality" means a number greater than one.

Hereinafter, certain exemplary embodiments according to the present disclosure will be described with reference to the accompanying drawings.

The technical solutions set forth in the invention comprise a frequency demultiplication adjustment method of PLL.

As shown in FIG. 1, a frequency demultiplication adjustment method of PLL, applied to an embedded system, providing a phase-locked loop, a processor and a processor frequency adjustor;

wherein the method comprises following steps of:

Step S1, obtaining a plurality of corresponding frequency demultiplication frequency points according to a default frequency demultiplication value of the phase-locked loop;

Step S2, obtaining a load state of the processor within a predetermined sampling period, and obtaining a target frequency point of the processor according to the load state by the processor frequency adjustor;

Step S3, determining a frequency range of a virtual frequency point to be added according to the position of the target frequency point between the frequency points;

Step S4, performing calculation within the frequency range to obtain equivalent frequencies corresponding to a plurality of virtual frequency points;

Step S5, judging whether the frequency of the target frequency point is equal to the equivalent frequency corresponding to the virtual frequency points; if not, switching the processor frequency adjustor to the corresponding frequency demultiplication frequency point; and Step S6, adjusting the frequency demultiplication value of the phase-locked loop, so that the phase-locked loop outputs a clock source signal corresponding to the virtual frequency points to the processor.

For the technical solutions to solving the problems in the prior art, defects in one of the technical solutions are described as follows.

When the CPU only uses the clock source provided by the PLL having the highest frequency, the PLL is always locked at the highest frequency, and only the external frequency demultiplication value is modified during a frequency modulation. And the default frequency demultiplication values can only be positive integers, such as 1, 2, 4, 8, and 16. It is assumed that the CPU has the highest operating frequency of 1536 MHz, within this frequency demultiplication solution, only a few frequency points such as 768, 384, 192 and 96 can be obtained. At this time, the CPU frequency has no other available frequency points in the frequency range of 768 MHz to 1536 MHz, and generally, an interval between the frequency points is in the range of 100 MHz to 200 MHz.

Thus, the existing solution has some defects that available frequency points are insufficient, and a dramatic fluctuation occurs when s a difference between the frequencies corresponding to each frequency point is large.

In the above-mentioned technical solution, after the phase-locked loop obtains a plurality of frequency demultiplication frequency points according to a default frequency demultiplication value of the phase-locked loop; obtaining a load state of the processor within a predetermined sampling period, and obtaining a target frequency point of the processor according to the load state by the processor frequency adjustor; then determining a frequency range of a virtual frequency point according to the virtual frequency point, and obtaining an equivalent frequency corresponding to the virtual frequency point within the frequency range; judging whether the frequency of the target frequency point is equal to the equivalent frequency corresponding to the virtual frequency points, if yes, modifying the frequency demultiplication value of the phase-locked loop, so that the phase-locked loop outputs a clock source signal corresponding to the virtual frequency points to the processor.

In a preferred embodiment, in Step S1, the phase-locked loop obtains the plurality of frequency points according to a maximum working rate and the plurality of default frequency demultiplication values of the processor;

wherein the plurality of default frequency demultiplication values are 1, 2, 4, 8, 16.

In the above-mentioned technical solution, it is assumed that the frequency demultiplication frequency points, which can be obtained through the above-mentioned default frequency demultiplication values, are 768, 384, 192 and 96, respectively when the highest frequency of the processor is 1536 MHz.

In a preferred embodiment, in Step S3, obtaining a highest frequency point and a lowest frequency point from the frequency range, and defining N the virtual frequency points between the highest frequency point and the lowest frequency point, wherein N>0.

In the above-mentioned solution, it is assumed that in Step S2, when the frequency of the target frequency point is calculated to be 960 MHz, the frequency of 960 herewith is between the frequency point of 1536 and the frequency point of 768, so that the frequency range of the virtual frequency points is from 1536 MHz to 768 MHz, and 1536 is taken as the highest frequency point, and 768 is taken as the lowest frequency point, and N=3 virtual frequency points are defined between 1536 and 768.

Figure 2:
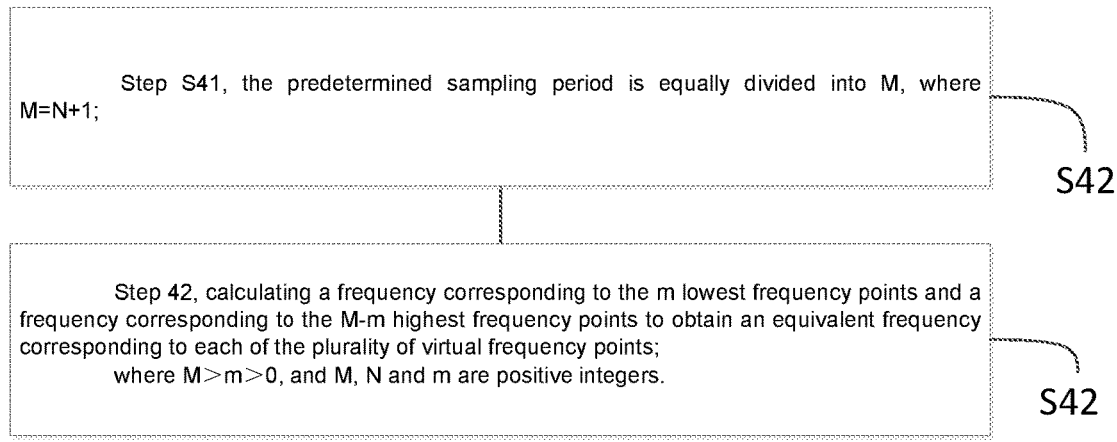
FIG. 2 is a flowchart of obtaining an equivalent frequency by calculation in a frequency demultiplication adjustment method of PLL according to an embodiment of the present invention.

In a preferred embodiment, as shown in FIG. 2, in Step S4,
the method further comprises following steps of:
Step S41, dividing the predetermined sampling period equally into M, wherein M=N+1;
Step 42, calculating a frequency corresponding to the m lowest frequency points and a frequency corresponding to the M−m highest frequency points to obtain an equivalent frequency corresponding to each of the plurality of virtual frequency points;
wherein M>m>0, and M, N and m are positive integers.

In a preferred embodiment, in Step S42, a method for obtaining an equivalent frequency corresponding to each of the plurality of target virtual frequency points through the processor frequency adjustor is provided, which is given by the following formula:

$$fe = \frac{X \times fl + (M - X)fh}{M}$$

wherein fe represents the equivalent frequency corresponding to each of the plurality of target virtual frequency points, fl represents the frequency corresponding to the lowest frequency point, fh represents the frequency corresponding to the highest frequency point, M represents the number of the predetermined sampling period which is equally divided into, x (1, 2, 3 . . . m) represents the number, wherein M>m>0, and both M and m are positive integers.

In the above-mentioned technical solution, the frequency range corresponding to the virtual frequency points described above is further described, wherein the equivalent frequencies corresponding to the virtual frequency points are as follows:
when m=1, (1*768+(4−1)*1536)/4=1134 MHz;
when m=2, (2*768+(4−2)*1536)/4=1152 MHz;
when m=3, (3*768+(4−3)*1536)/4=960 MHz.

In a preferred embodiment, a timer is disposed in a kernel of the embedded system, the sampling period is equally divided into M by the timer, and the timer is configured to be turned off when switching the processor frequency adjustor to the frequency demultiplication frequency point.

In a preferred embodiment, a counter is disposed in the kernel of the embedded system, within the sampling period, in interrupts are calculated by the counter, and the frequency demultiplication value of the phase-locked loop is modified in the in interrupts, such that the phase-locked loop is locked at the frequency corresponding to the lowest frequency point;
subsequently, M−m interrupts are calculated by the counter, and the frequency demultiplication value of the phase-locked loop is modified in the M−m interrupts, such that the phase-locked loop is locked at the frequency corresponding to the highest frequency point.

In a preferred embodiment, the predetermined sampling period of the processor frequency adjustor is 100 ms.

A specific embodiment is illustrated hereinafter. It is assumed that working frequency of the processor is in the range of 768 MHz to 1536 MHz, and the single-step frequency difference reaches 768 MHz, the frequency corresponding to the maximum frequency point is 1536 MHz, and the frequency corresponding to the minimum frequency point is 768 MHz;

M is 4, N=M−1=3, that is, three virtual frequency points are added;

when in is selected from 1, 2, and 3, different equivalent frequencies obtained according to in are as follows:

$$fe = \frac{X \times fl + (M - X)fh}{M}$$

when m=1, (1*768+(4−1)*1536)/4=1244 MHz;
when m=2, (2*768+(4−2)*1536)/4=1152 MHz;
when m=3, (3*768+(4−3)*1536)/4=960 MHz;

obtaining the frequencies corresponding to the extra three virtual frequency points by calculation, and the frequencies (1344 MHz, 1152 MHz, and 960 MHz) corresponding to the virtual frequency points are formed in a set;

The processor frequency adjustor obtains the operating frequency of 1344 MHz according to the load of the processor, and matches the operating frequency with the frequency corresponding to the virtual frequency point in the set. If a match occurs, the virtual frequency point of the match is defined as the target virtual frequency point;

a frequency of 1344 MHz corresponding to the virtual frequency point is obtained according to the virtual frequency point.

In a preferred embodiment, a timer is disposed in a kernel of the embedded system, the sampling period is equally divided into M by the timer, and the timer is configured to be turned off when switching the processor frequency adjustor to the frequency demultiplication frequency point.

In a preferred embodiment, a counter is disposed in the kernel of the embedded system, within the sampling period, in interrupts are calculated by using the counter, and the frequency demultiplication value of the phase-locked loop is modified in the in interrupts, such that the phase-locked loop is locked at the frequency corresponding to the lowest frequency point;

subsequently, M−m interrupts are calculated by the counter, and the frequency demultiplication value of the phase-locked loop is modified in the M−m interrupts, such that the phase-locked loop is locked at the frequency corresponding to the highest frequency point.

In a preferred embodiment, the predetermined sampling period of the processor frequency adjustor is 100 ms.

A specific embodiment is illustrated hereinafter. It is assumed that working frequency of the processor is in the range of 768 MHz to 1536 MHz, and the single-step frequency difference reaches 768 MHz, the frequency corresponding to the maximum frequency point is 1536 MHz, and the frequency corresponding to the minimum frequency point is 768 MHz;

M is 4, N=M−1=3, that is, three virtual frequency points are added;

when in is selected from 1, 2, and 3, different equivalent frequencies obtained according to in are as follows:

$$fe = \frac{X \times fl + (M-X)fh}{M}$$

the value of X is at (1, 2, 3 . . . m);
when m=1, (1*768+(4−1)*1536)/4=1344 MHz;
when m=2, (2*768+(4−2)*1536)/4=1152 MHz;
when m=3, (3*768+(4−3)*1536)/4=960 MHz;
obtaining the frequencies corresponding to the extra three virtual frequency points (1344 MHz, 1152 MHz, and 960 MHz) by calculation;
the processor frequency adjustor obtains a target frequency point of 1344 according to the load of the processor;
modifying the frequency demultiplication value of the phase-locked loop, so that the phase-locked loop outputs a clock source signal corresponding to the virtual frequency points to the processor. Specifically, in one of the interrupts, adjusting the frequency s demultiplication value of the phase-locked loop, such that the phase-locked loop is locked at the frequency of 68 MHz; in M−m=4−1=3 interrupts, adjusting the frequency demultiplication value of the phase-locked loop, such that the phase-locked loop is locked at the frequency of 1536 MHz, and that the clock source signal corresponding to equivalent frequency equivalently formed is output to the processor;

and other equivalent frequencies at the virtual frequency points can obtain the corresponding clock source signal through the above calculation and send the same to the processor.

Figure 3:
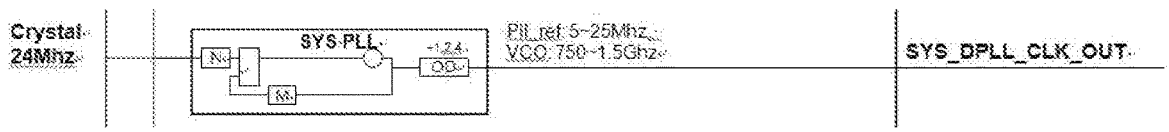
FIG. 3 is a schematic block diagram of a PLL in a frequency demultiplication adjustment method of PLL according to an embodiment of the present invention.

A block diagram of the principle of PLL is shown in FIG. 3;

when the PLL is operating, N and M are used to configure the output frequency of the PLL. Once the PLL is locked, the values of N and M are not modified. The only thing that can be modified is the outer partial frequency value (OD), which can only take the value of $2^n$ power of 1/2/4/8. Due to this natural limitation in terms of hardware values, no frequency points are available in the frequency range of [½−1]* PLL output values.

Figure 4:
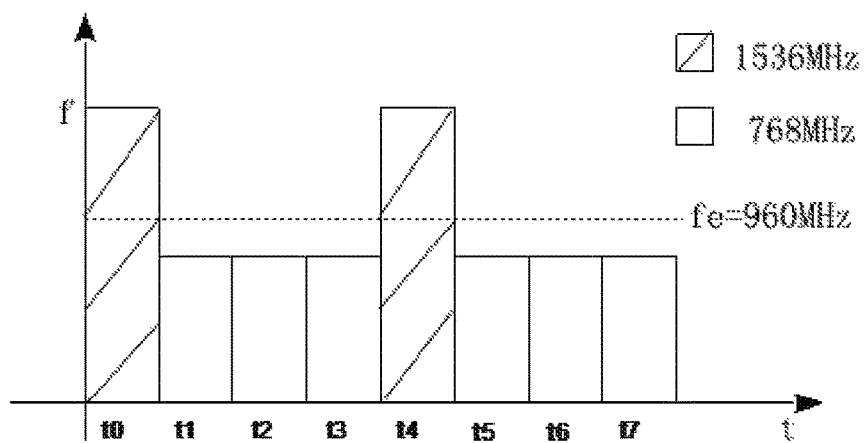
FIG. 4 is a bar chart of an equivalent frequency of an output virtual frequency point in a frequency demultiplication adjustment method of PLL according to an embodiment of the present invention.

When the lock value of the PLL is high, the bandwidth not available for frequency points will become very large, leading to a side effect of a frequency fluctuation.

b) The actual implementation process of the virtual frequency points is as follows:

as shown in FIG. 4, the PLL is locked at the frequency of 1536 MHz. The non-dashed box indicates that the PLL output the frequency of 768 MHz, and the OD (frequency demultiplication value)=2, and the dashed box indicates that the PLL outputs the frequency of 1536 MHz, and OD=1.

In a frequency modulation period, ie, the sampling period, divide its time is equally into M, wherein M=8, that is, from t0 to t7, setting OD to 1 in time slices t0, t4, and setting OD to 2 in the rest of time slices. In this way, in the whole frequency modulation period, there are 2 time slices running at the frequency of 1536 MHz and 6 time slices running at the frequency of 768 MHz. Then the duty cycle of the high frequency point is 2/(6+2)=25%, and the equivalent frequency of the whole period is (0.25*1536+(1−0.25)*768) =960 MHz.

Similarly, adjusting the division of the duty cycle, for example, set ting the OD of the time slices t0, t2, t4, t8 to 1, output 1536 MHz, set the OD of the time slices t1, t3, t5, t7 to 2, and outputting the frequency of 768 MHz. Then the duty cycle is 50% and the equivalent frequency is 1152 MHz.

Obviously, different ratios of different high frequencies can be adjusted to obtain different equivalent frequencies. These equivalent virtual frequencies can be used as a complement to the available frequency points.

The above descriptions are only the preferred embodiments of the invention, not thus limiting the embodiments and scope of the invention. Those skilled in the art should be able to realize that the schemes obtained from the content of specification and drawings of the invention are within the scope of the invention.

What is claimed is:

1. A frequency demultiplication adjustment method of a phase-locked loop (PLL), applied to an embedded system, providing a phase-locked loop, a processor and a processor frequency adjustor;

wherein the method comprises following steps of:

Step S1, obtaining a plurality of corresponding frequency demultiplication frequency points according to a default frequency demultiplication value of the phase-locked loop;

Step S2, obtaining a load state of the processor within a predetermined sampling period, and obtaining a target frequency point of the processor according to the load state by the processor frequency adjustor;

Step S3, determining a frequency range of a virtual frequency point to be added according to the position of the target frequency point between the frequency points;

Step S4, performing calculation within the frequency range to obtain equivalent frequencies corresponding to a plurality of virtual frequency points;

Step S5, judging whether the frequency of the target frequency point is equal to the equivalent frequency corresponding to one of the virtual frequency points; if not, switching the processor frequency adjustor to the corresponding frequency demultiplication frequency point; and Step S6, adjusting the frequency demultiplication value of the phase-locked loop, so that the phase-locked loop outputs a clock source signal corresponding to the virtual frequency points to the processor.

2. The frequency demultiplication adjustment method as claimed in claim 1, wherein in Step S1, the phase-locked loop obtains the plurality of frequency points according to a maximum working rate and the plurality of default frequency demultiplication values of the processor;

wherein the plurality of default frequency demultiplication values are 1, 2, 4, 8, 16.

3. The frequency demultiplication adjustment method as claimed in claim 1, wherein in Step S3, obtaining a highest frequency point and a lowest frequency point from the frequency range, and defining N the virtual frequency points between the highest frequency point and the lowest frequency point, wherein N>0.

4. The frequency demultiplication adjustment method as claimed in claim 2, wherein in Step S4, the method further comprises following steps of:

Step S41, the predetermined sampling period is equally divided into M, wherein M=N+1;

Step 42, calculating a frequency corresponding to the m lowest frequency points and a frequency corresponding to the M-m highest frequency points to obtain an equivalent frequency corresponding to each of the plurality of virtual frequency points;

wherein M>m>0, and M, N and m are positive integers.

5. The frequency demultiplication adjustment method as claimed in claim 1, wherein in Step S42, a method for obtaining an equivalent frequency corresponding to each of the plurality of target virtual frequency points through the processor frequency adjustor is provided, which is given by the following formula:

$$fe = \frac{X \times fl + (M - X)fh}{M}$$

wherein fe represents the equivalent frequency corresponding to each of the plurality of target virtual frequency points, fl represents the frequency corresponding to the lowest frequency point, fh represents the frequency corresponding to the highest frequency point, M represents the number of the predetermined sampling period which is equally divided into, x (1, 2, 3 ... m) represents the number, wherein M>m>0, and both M and m are positive integers.

6. The frequency demultiplication adjustment method as claimed in claim 1, wherein a timer is disposed in a kernel of the embedded system, the sampling period is equally divided into M by the timer, and the timer is configured to be turned off when switching the processor frequency adjustor to the frequency demultiplication frequency point.

7. The frequency demultiplication adjustment method as claimed in claim 3, wherein a counter is disposed in the kernel of the embedded system, within the sampling period, m interrupts are calculated by the counter, and the frequency demultiplication value of the phase-locked loop is modified in the m interrupts, such that the phase-locked loop is locked at the frequency corresponding to the lowest frequency point;

subsequently, M-m interrupts are calculated by the counter, and the frequency demultiplication value of the phase-locked loop is modified in the M-m interrupts, such that the phase-locked loop is locked at the frequency corresponding to the highest frequency point.

8. The frequency demultiplication adjustment method as claimed in claim 1, wherein the predetermined sampling period of the processor frequency adjustor is 100 ms.

* * * * *